US009112453B2

(12) United States Patent
Wang et al.

(10) Patent No.: US 9,112,453 B2
(45) Date of Patent: Aug. 18, 2015

(54) OPERATIONAL AMPLIFIER CIRCUIT (71) Applicant: Novatek Microelectronics Corp., Hsinchu (TW)

(72) Inventors: Pei-Ye Wang, Taipei (TW); Ji-Ting Chen, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 54 days.

(21) Appl. No.: 14/014,368

(22) Filed: Aug. 30, 2013

(65) Prior Publication Data
US 2014/0306768 A1   Oct. 16, 2014

(30) Foreign Application Priority Data

Apr. 15, 2013 (TW) .............................. 102113299 A (51) Int. Cl.
*H03F 1/14* (2006.01)
*H03F 3/16* (2006.01)
(52) U.S. Cl.
CPC .......................................... *H03F 3/16* (2013.01)
(58) Field of Classification Search
USPC .................................... 330/252–261, 292, 76
See application file for complete search history.

(56) References Cited

U.S. PATENT DOCUMENTS

| | | | |
|---|---|---|---|
| 6,522,199 B2* | 2/2003 | Sidiropoulos et al. | 330/292 |
| 7,652,534 B1 | 1/2010 | Lin et al. | |
| 8,054,134 B2* | 11/2011 | Huang et al. | 330/292 |
| 2012/0133632 A1* | 5/2012 | Hsu | 345/211 |

OTHER PUBLICATIONS

"Office Action of Taiwan Counterpart Application", issued on Jun. 10, 2015, p1-p5, in which the listed reference was cited.

* cited by examiner

*Primary Examiner* — Hieu Nguyen
(74) *Attorney, Agent, or Firm* — Jianq Chyun IP Office (57) ABSTRACT

An operational amplifier circuit including a main circuit, a compensation capacitor, a power circuit, and a set of switches is disclosed. The main circuit has an output terminal. The compensation capacitor has a first end connected to an internal node of the main circuit and a second end connected to the output terminal of the main circuit. The power circuit provides a current or a voltage as predetermined. The set of switches connects the power circuit to the compensation capacitor. When the main circuit is not in an output state, the set of switches is switched to allow the power circuit to provide the current or voltage to the compensation capacitor. When the main circuit is in the output state, the set of switches is switched to disconnect the power circuit from the compensation capacitor and allow the main circuit to return to an output circuit state and operate normally.

16 Claims, 11 Drawing Sheets

OPERATIONAL AMPLIFIER CIRCUIT

CROSS-REFERENCE TO RELATED APPLICATION

This application claims the priority benefit of Taiwan application serial no. 102113299, filed on Apr. 15, 2013. The entirety of the above-mentioned patent application is hereby incorporated by reference herein and made a part of this specification.

BACKGROUND OF THE INVENTION

1. Field of the Invention

The present invention relates to an operational amplifier circuit offering a fixed slew rate (SR).

2. Description of Related Art

Figure 1:
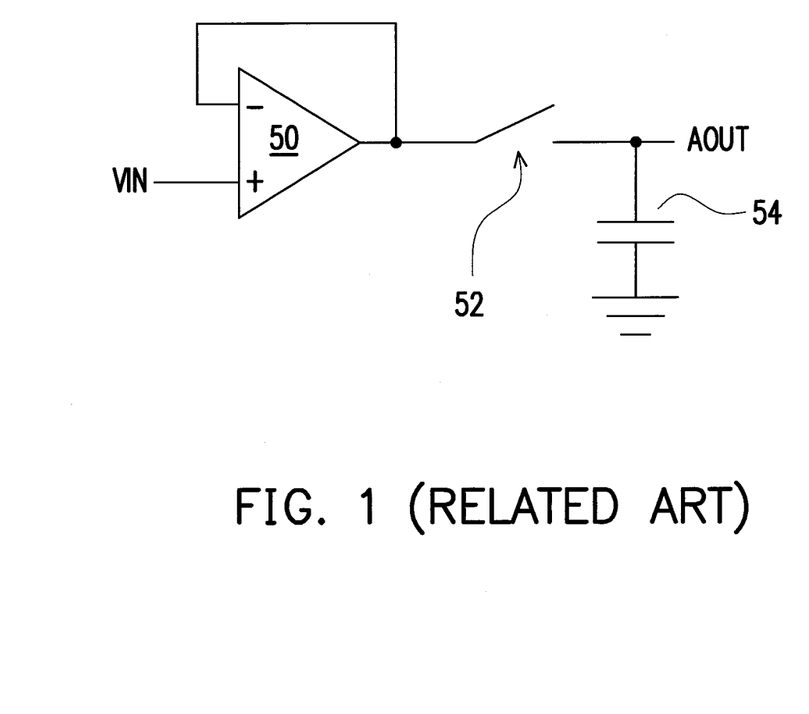
FIG. 1 is an equivalent block diagram of a conventional operational amplifier and a load capacitor thereof.

Operational amplifiers are broadly used. FIG. 1 is an equivalent block diagram of a conventional operational amplifier and a load capacitor.

Referring to FIG. 1, the circuit structure includes an operational amplifier 50 and an output switch 52. An external load circuit is connected to the switch 52. In a load equivalent mode, the load circuit has an equivalent load capacitor 54. When the switch 52 receives a control signal and accordingly is turned on, the operational amplifier 50 starts to charge/discharge the output terminal AOUT. If the operational amplifier 50 charges the output terminal AOUT for a long time, a large peak current will be generated at the instant when the switch 52 is turned on, which will result in the problem of electromagnetic interference (EMI).

The output terminal of an operational amplifier circuit is usually connected to a compensation capacitor, and the capacitance of the compensation capacitor is Cc. When the switch 52 of the operational amplifier is turned on and accordingly enters an output state, the charging time of the compensation capacitor has a slew rate (SR). The SR and the charging time T satisfy the relationship of $SR = I/C = \Delta V/T$. Different charging time will result in different SR. When the operational amplifier 50 charges/discharges the load circuit, an instantaneous large peak current will be generated, and the SR will be changed. As a result, the EMI problem will be produced.

The issue of SR should be taken into consideration when the operational amplifier 50 is designed.

SUMMARY OF THE INVENTION

Accordingly, the present invention is directed to an operational amplifier circuit, in which the slew rate (SR) is maintained at a stable value.

An exemplary embodiment of the present invention provides an operational amplifier circuit. The operational amplifier circuit includes a main circuit, a compensation capacitor, a power circuit, and a set of switches. The main circuit has an output terminal. A first end of the compensation capacitor is connected to an internal node of the main circuit, and a second end of the compensation capacitor is connected to the output terminal of the main circuit. The power circuit provides a predetermined current or a predetermined voltage. The set of switches connects the power circuit to the compensation capacitor. When the main circuit is not in an output state, the set of switches is switched to allow the power circuit to provide the current or the voltage to the compensation capacitor. When the main circuit is in the output state, the set of switches is switched to disconnect the power circuit from the compensation capacitor and allow the main circuit to return to an output circuit state and operate normally.

An exemplary embodiment of the present invention provides an operational amplifier circuit. The operational amplifier circuit includes a main circuit, a compensation capacitor, and a set of switches. The main circuit has an output terminal. A first end of the compensation capacitor is connected to an internal node of the main circuit, and a second end of the compensation capacitor is connected to the output terminal of the main circuit. The set of switches is disposed on a connection path between the main circuit and the compensation capacitor. When the main circuit is not in an output state, the set of switches is switched to allow a part of the main circuit to form a power circuit and provide a current or a voltage to the compensation capacitor. When the main circuit is in the output state, the set of switches is switched to allow the main circuit to return to an output circuit state and operate normally.

These and other exemplary embodiments, features, aspects, and advantages of the invention will be described and become more apparent from the detailed description of exemplary embodiments when read in conjunction with accompanying drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
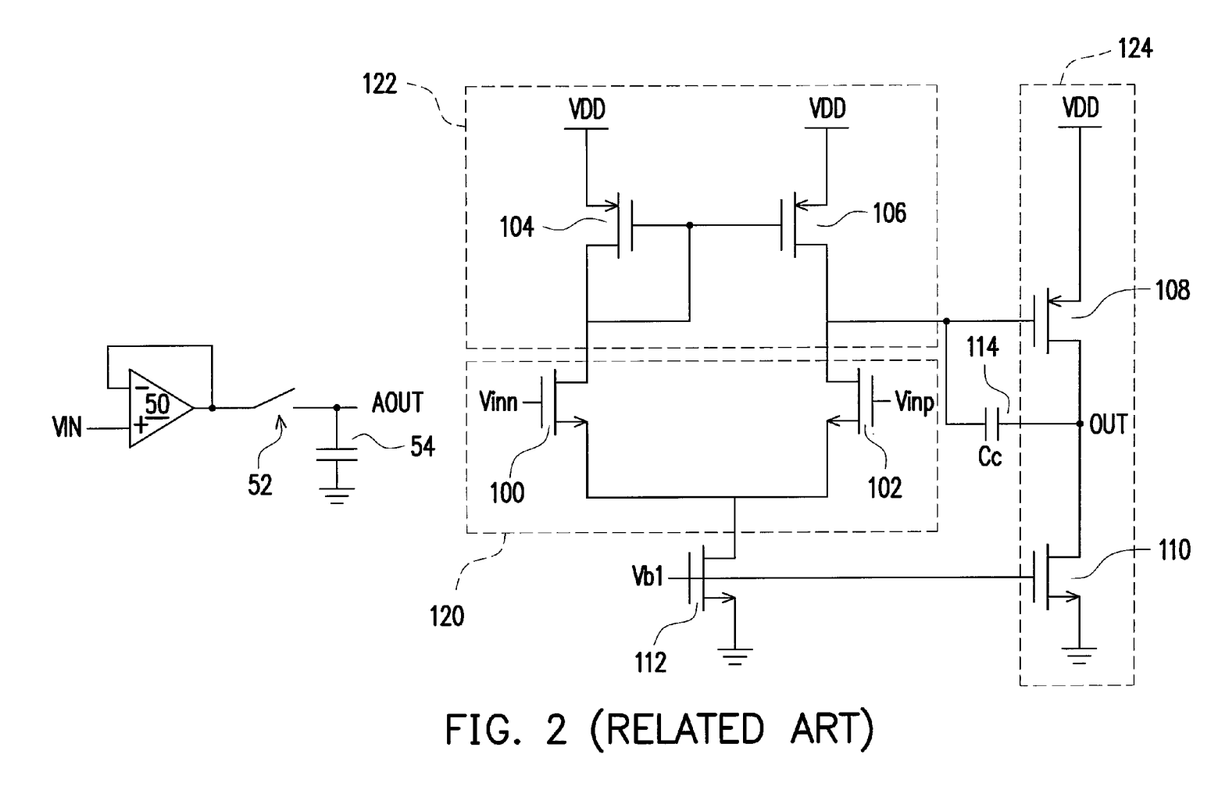
FIG. 2 is a circuit diagram of a conventional operational amplifier circuit.

The relationship between a conventional operational amplifier circuit and a load thereof will be explained first. FIG. 2 is a circuit diagram of a conventional operational amplifier circuit. Referring to FIG. 2, the operational amplifier 50 outputs to the equivalent load capacitor 54 when the switch 52 is turned on, as shown by the left part of FIG. 2. The right part of FIG. 2 illustrates an internal circuit structure of the operational amplifier 50. The operational amplifier 50 includes a voltage-to-current converting circuit 120, a current operation circuit 122, and an amplifying circuit 124. For the convenience of description, below, the voltage-to-current converting circuit 120, the current operation circuit 122, and the amplifying circuit 124 are referred to as a main circuit. It should be noted that a compensation capacitor 114 is further connected to the output terminal OUT of the amplifying circuit 124, and the capacitance of the compensation capacitor 114 is Cc. The other end of the compensation capacitor 114 is usually connected to the output terminal of the current operation circuit 122.

To be specific, herein it is assumed that the voltage-to-current converting circuit 120 is composed of N-type transistors 100 and 102. The gate of the transistor 100 may be a negative input terminal for receiving an output/feedback voltage signal Vinn. The gate of the transistor 102 may be a positive input terminal for receiving an input voltage signal Vinp. The sources of the transistors 100 and 102 are connected to the ground voltage through the transistor 112. The gate of the transistor 112 is controlled by a signal Vb1.

The current operation circuit 122 includes transistors 104 and 106. The gates of the transistors 104 and 106 are both connected to the drain of the transistor 100 in the voltage-to-current converting circuit 120, the sources thereof are connected to a system voltage VDD, and the drains thereof are respectively connected to the drains of the transistors 100 and 102.

The amplifying circuit 124 includes transistors 108 and 110. The transistors 108 and 110 are serially connected, and the connection point between the transistors 108 and 110 is the output terminal OUT or AOUT in the left part of FIG. 2.

The operational amplifier 50 may have different circuit designs. However, the compensation capacitor 114 is disposed at the output terminal in any design. Operations regarding the compensation capacitor 114 will be described with reference to exemplary embodiments of the present invention, but the circuit design of the main circuit is not limited herein.

In order to allow the operational amplifier 50 to maintain a stable slew rate (SR), in an exemplary embodiment of the present invention, when the switch 52 is turned off, a transient voltage or current may be supplied to the compensation capacitor 114 to keep charging/discharging the compensation capacitor 114, so that a stable SR can be achieved regardless of the turned-on duration of the switch 52.

Below, some exemplary embodiments of the present invention will be described. However, these exemplary embodiments are not intended to limit the scope of the present invention and can be appropriately combined.

Figure 3:
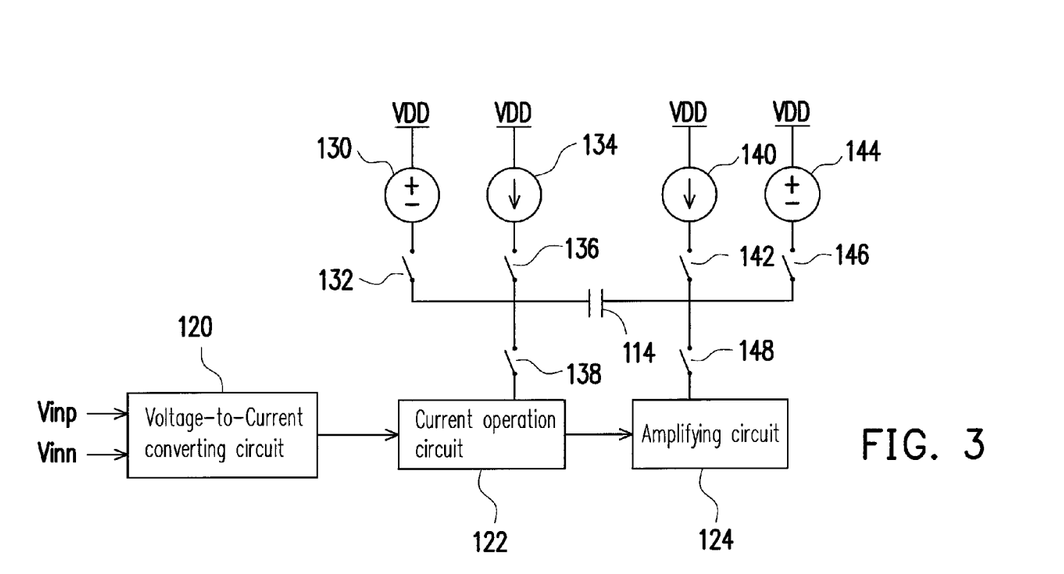
FIG. 3 is a block diagram of an operational amplifier circuit according to an exemplary embodiment of the present invention.

FIG. 3 is a block diagram of an operational amplifier circuit according to an exemplary embodiment of the present invention. Referring to FIG. 3, according to the design concept of the present invention, the relationship between the compensation capacitor 114 and the main circuit (for example, the voltage-to-current converting circuit 120, the current operation circuit 122, and the amplifying circuit 124) is controlled through a plurality of switches 132, 136, 138, 142, 146, and 148, so that the compensation capacitor 114 is disconnected from at least a part of the main circuit, and an additional voltage or current is supplied by additional voltage sources 130 and 144 or current sources 134 and 140 to the compensation capacitor 114 to charge/discharge the same. The voltage sources 130 and 144 and the current sources 134 and 140 are generally referred to as power circuits, and which supply currents or voltages to the compensation capacitor 114.

The relationship between the compensation capacitor 114 and the main circuit is controlled through the on and off of the switches 132, 136, 138, 142, 146, 148. When the main circuit is not in an output state (i.e., the switch 52 is turned off), the set of switches is switched to allow a power circuit to provide a current or a voltage to the compensation capacitor 114. On the other hand, when the main circuit is in the output state (i.e., the switch 52 is turned on), the set of switches is switched to disconnect the power circuits 130, 134, 140, and 144 from the compensation capacitor 114 and allow the main circuit to return to an output circuit state and operate normally.

The on and off of each switch can be accomplished through a conventional technique and will not be explained herein.

Figure 4:
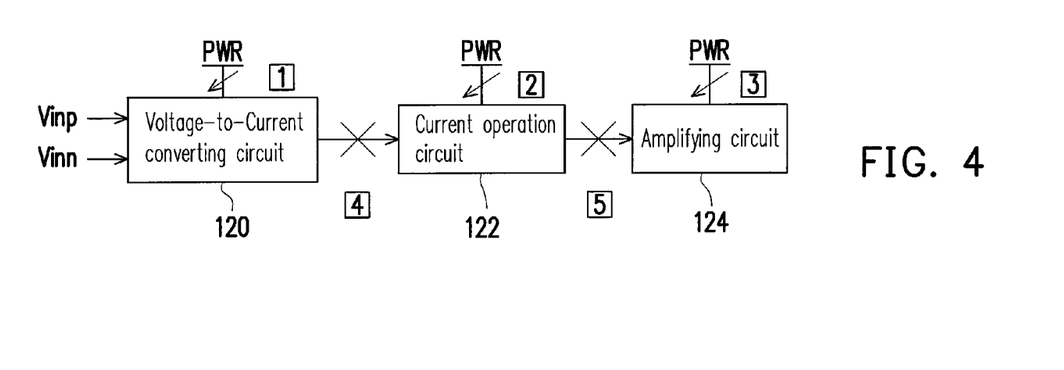
FIG. 4 is a diagram illustrating several techniques of disconnecting an operational amplifier circuit from a compensation capacitor 114 according to an exemplary embodiment of the present invention.

FIG. 4 is a diagram illustrating several techniques of disconnecting an operational amplifier circuit from a compensation capacitor 114 according to an exemplary embodiment of the present invention. Referring to FIG. 4, the operational amplifier circuit may be stopped from charging the compensation capacitor 114 by turning off a part of the power supply PWR or by turning off the original circuit by using a switch. For example, as marked with the symbol ①, the power supply PWR of the voltage-to-current converting circuit 120 is turned off. Or, as marked with the symbol ②, the power supply PWR of the current operation circuit 122 is turned off. Or, as marked with the symbol ③, the power supply PWR of the amplifying circuit 124 is turned off, so that the feedback of the operational amplifier circuit is cut off within a certain time. Or, as marked with the symbol ④, the output terminal of the voltage-to-current converting circuit 120 is disconnected from the input terminal of the current operation circuit 122. Or, as marked with the symbol ⑤, the output terminal of the current operation circuit 122 is disconnected from the input terminal of the amplifying circuit 124, so that the loop of the operational amplifier is cut off at a specific time. Additionally, the compensation capacitor can be switched to a current source or a voltage source of any magnitude.

Figure 5:
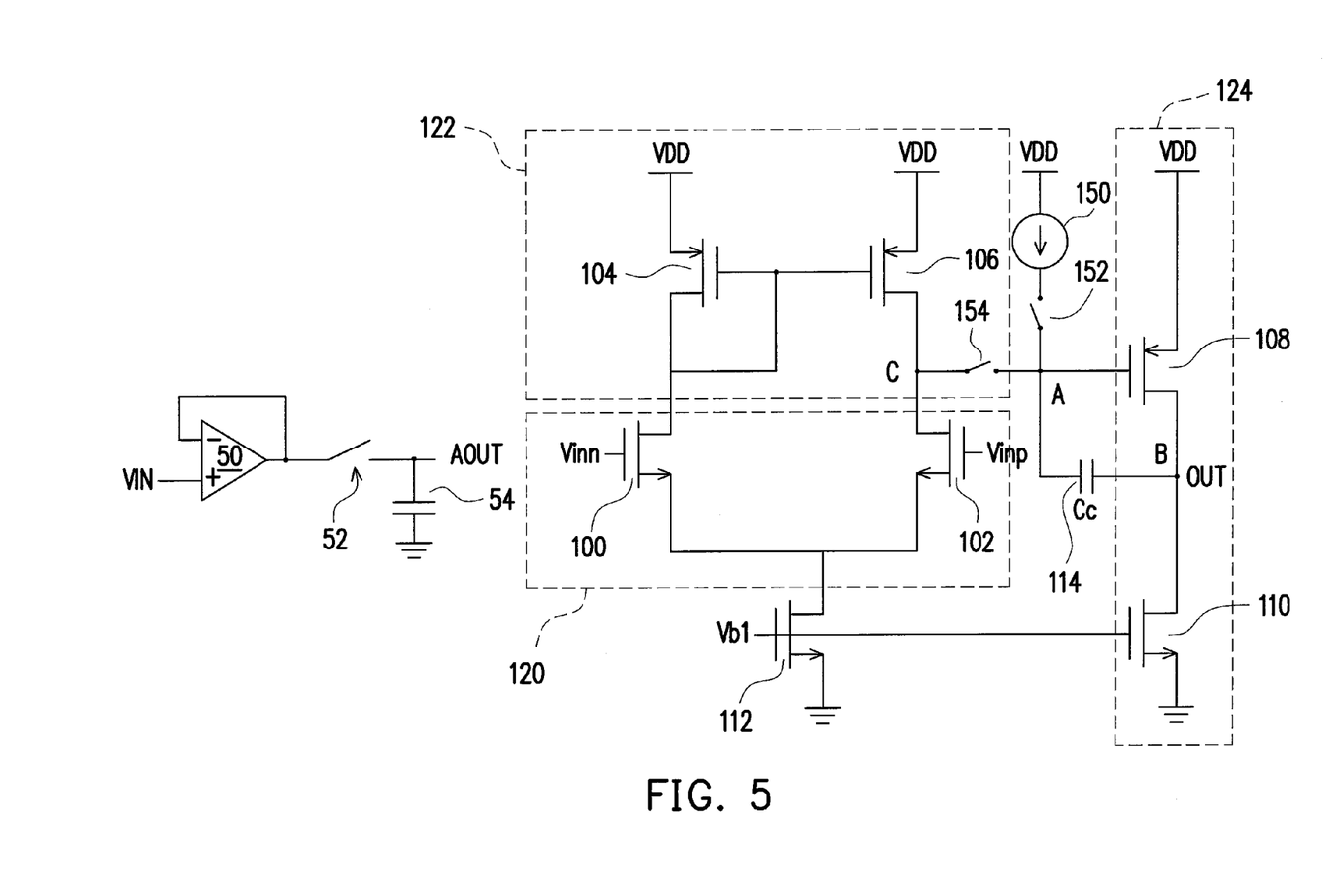
FIG. 5 is a diagram of an operational amplifier circuit according to an exemplary embodiment of the present invention.

FIG. 5 is a diagram of an operational amplifier circuit according to an exemplary embodiment of the present invention. Referring to FIG. 5, the present exemplary embodiment will be described by assuming that a current source is supplied to the compensation capacitor 114. In the original operational amplifier circuit, an end of the compensation capacitor 114 is the node A, and which is connected to an internal node C of the main circuit through the switch 154 (for example, the output terminal of the current operation circuit 122). The other end of the compensation capacitor 114 is the node B, and which is connected to the output terminal OUT. The additional power circuit (for example, the current source 150) is connected to the node A (i.e., to an end of the compensation capacitor 114) through the switch 152.

When the switch 52 is turned off (i.e., the main circuit is not in the output state), the switch 154 is turned off, and the switch 152 is turned on. Thus, when the main circuit is not in the output state, the current source 150 supplies a current to the compensation capacitor 114 to maintain a predetermined SR. Thereby, a large current generated at the charge/discharge instant is effectively eliminated and accordingly the problem of electromagnetic interference (EMI) is avoided.

When the switch 52 is turned on (i.e., the operational amplifier circuit is in a normal output state), the switch 154 is turned on, and the switch 152 is turned off. Accordingly, the current source 150 and the compensation capacitor 114 are turned off, and the operational amplifier circuit returns to the normal operation state.

Figure 6:
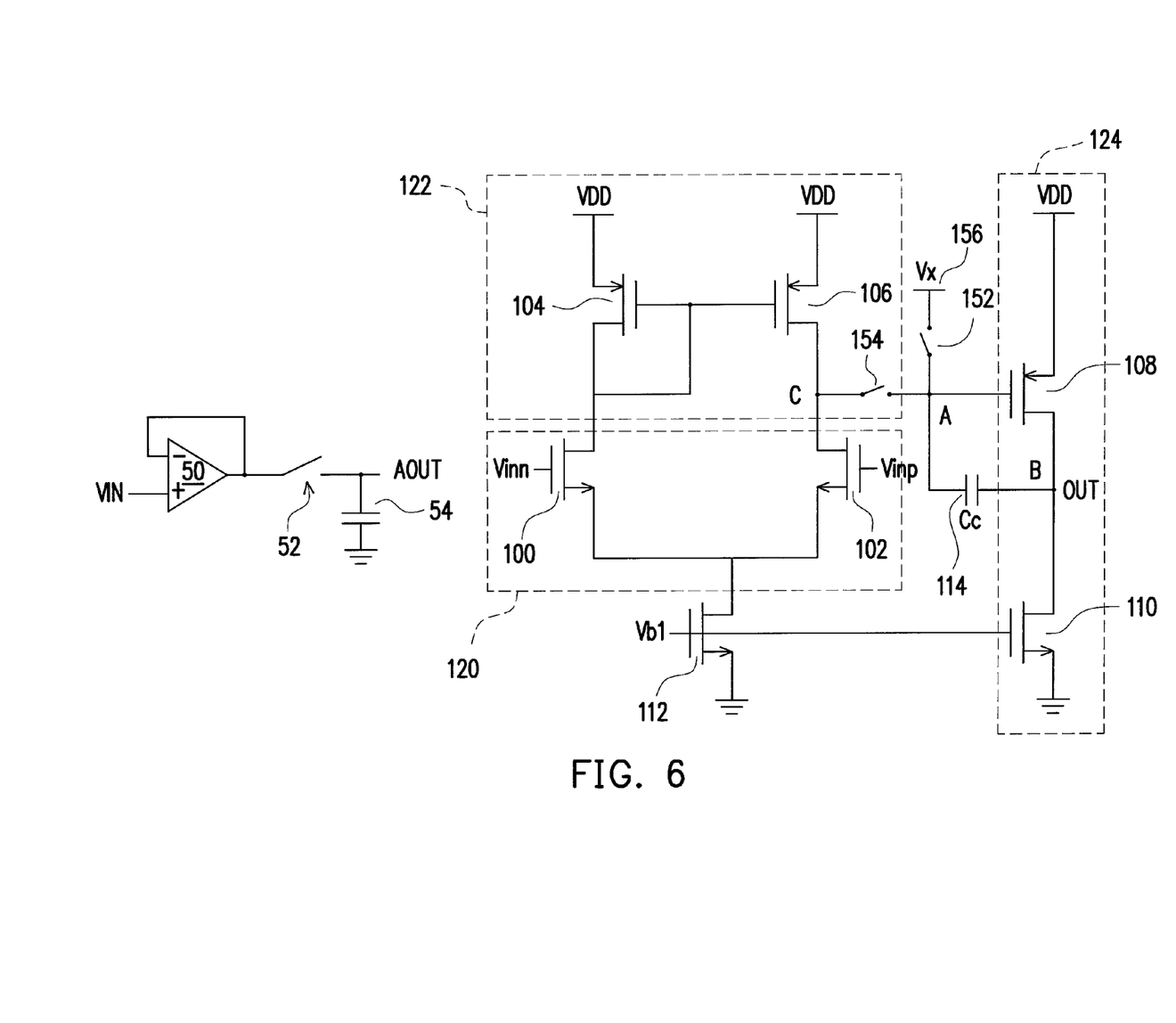
FIGS. 6-12 are diagrams of operational amplifier circuits according to exemplary embodiments of the present invention.

FIG. 6 is a diagram of an operational amplifier circuit according to an exemplary embodiment of the present invention. Referring to FIG. 6, the switch 152 and the switch 154 in the present exemplary embodiment are disposed in the same way as those illustrated in FIG. 5. However, a voltage source 156 is added in the present exemplary embodiment for supplying a voltage Vx to the compensation capacitor 114. The value of the voltage Vx is determined according to the actual requirement. The voltage Vx needs not to be the system voltage VDD but can be any other voltage. The operations of the switch 152 and the switch 154 can be referred to descriptions related to FIG. 5.

Figure 7:
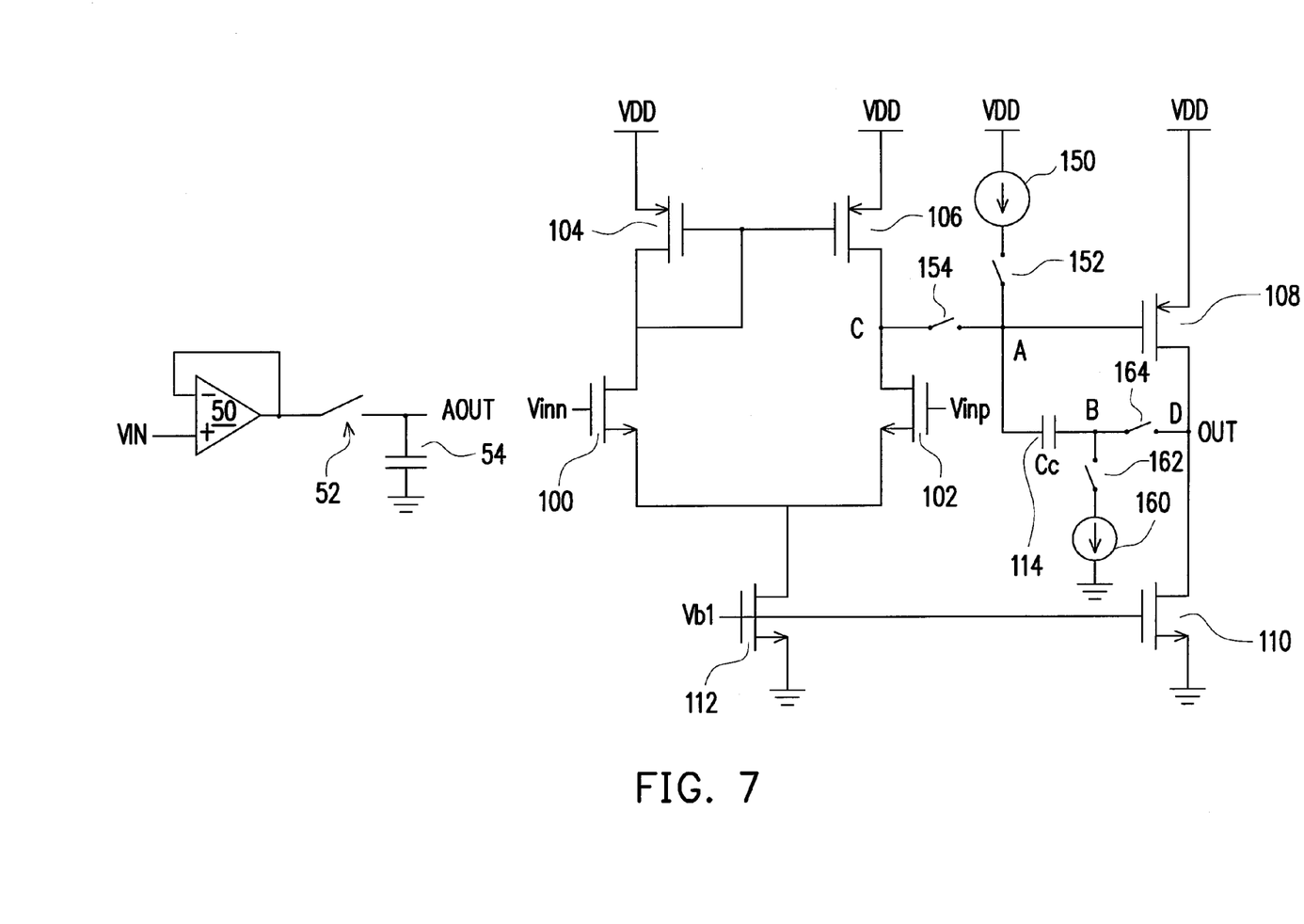

FIG. 7 is a diagram of an operational amplifier circuit according to an exemplary embodiment of the present invention. Referring to FIG. 7, in the present exemplary embodiment, two current sources 150 and 160 are adopted as the power circuit of the compensation capacitor 114. Based on the structure illustrated in FIG. 5, the connections between the switches 152 and 154 and the compensation capacitor 114 are maintained, and one end of the compensation capacitor 114 (i.e., node B) is further connected to the output terminal OUT through the switch 164. In the present embodiment, the output terminal OUT can be considered as a node D. Additionally, the current source 160 connected to the ground voltage is connected to the node B (i.e., to the other end of the compensation capacitor 114) through the switch 162.

When the switch 52 is turned off (i.e., the main circuit is not in the output state), the switch 154 and the switch 164 are also turned off, and the switch 152 and the switch 162 are turned on. Thus, when the main circuit is not in the output state, the current source 150 and the current source 160 keep supplying currents to the compensation capacitor 114, so as to maintain a predetermined SR. Thereby, a large current generated at the charge/discharge instant is effectively eliminated and accordingly the problem of EMI is avoided.

When the switch 52 is turned on (i.e., the operational amplifier circuit is in a normal operation state), the switch 154 and the switch 164 are turned on, and the switch 152 and the switch 162 are turned off. Thus, the current sources 150 and 160 and the compensation capacitor 114 are turned off, and the operational amplifier circuit returns to the normal operation state.

Figure 8:
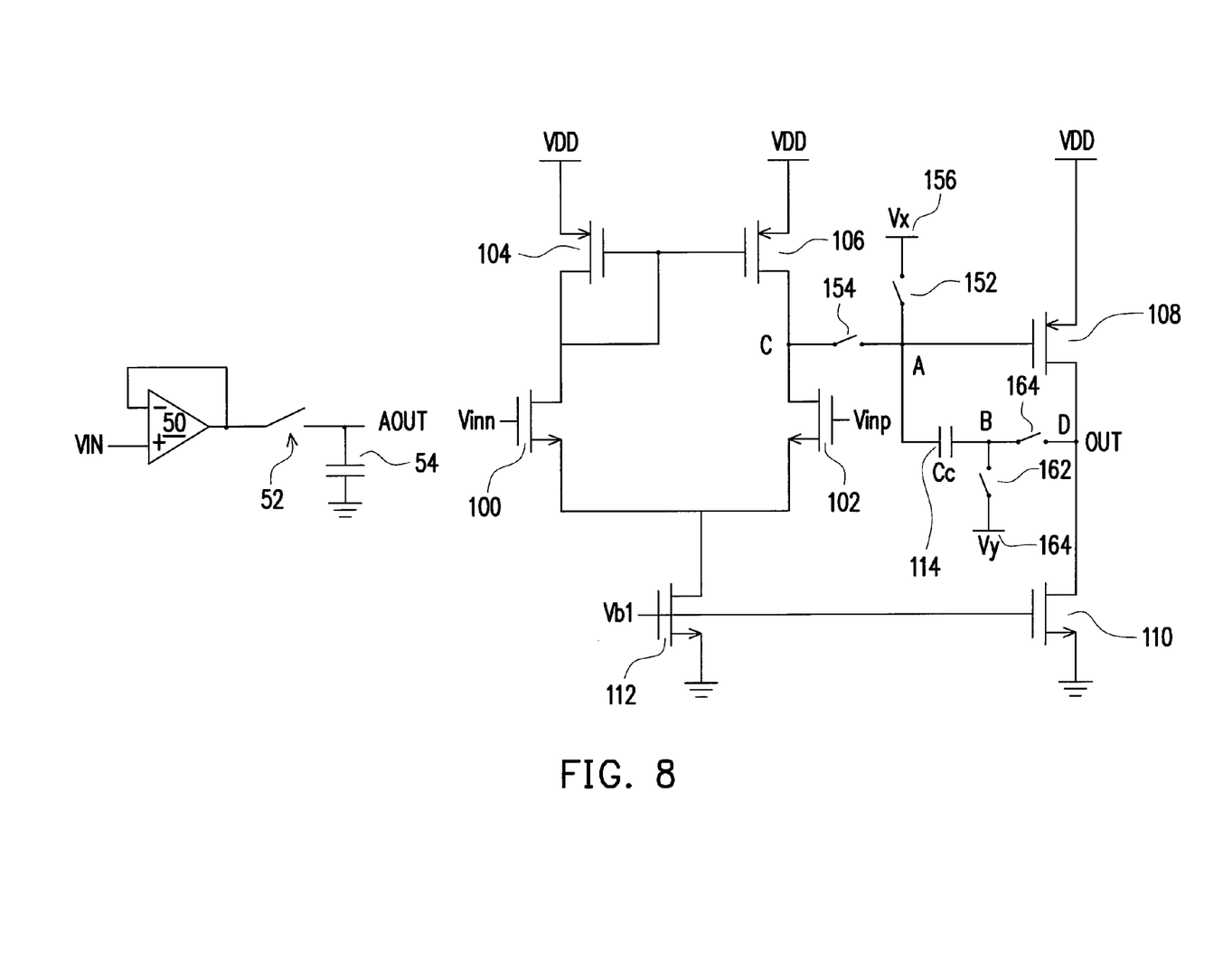

FIG. 8 is a diagram of an operational amplifier circuit according to an exemplary embodiment of the present invention. Referring to FIG. 8, the switches 152, 154, 162, and 164 in the present exemplary embodiment are disposed in the same way as those illustrated in FIG. 7. However, in the present exemplary embodiment, a voltage source 156 and a voltage source 164 are adopted as the power circuit of the compensation capacitor 114 for supplying a bias between the voltage Vx and the voltage Vy to the compensation capacitor 114. The values of the voltages Vx and Vy are determined according to the actual requirement. The voltages Vx and Vy need not to be the system voltage VDD or the ground voltage but can be any other voltage levels. The operations of the switches 152, 154, 162, and 164 can be referred to the descriptions related to FIG. 7.

Figure 9:
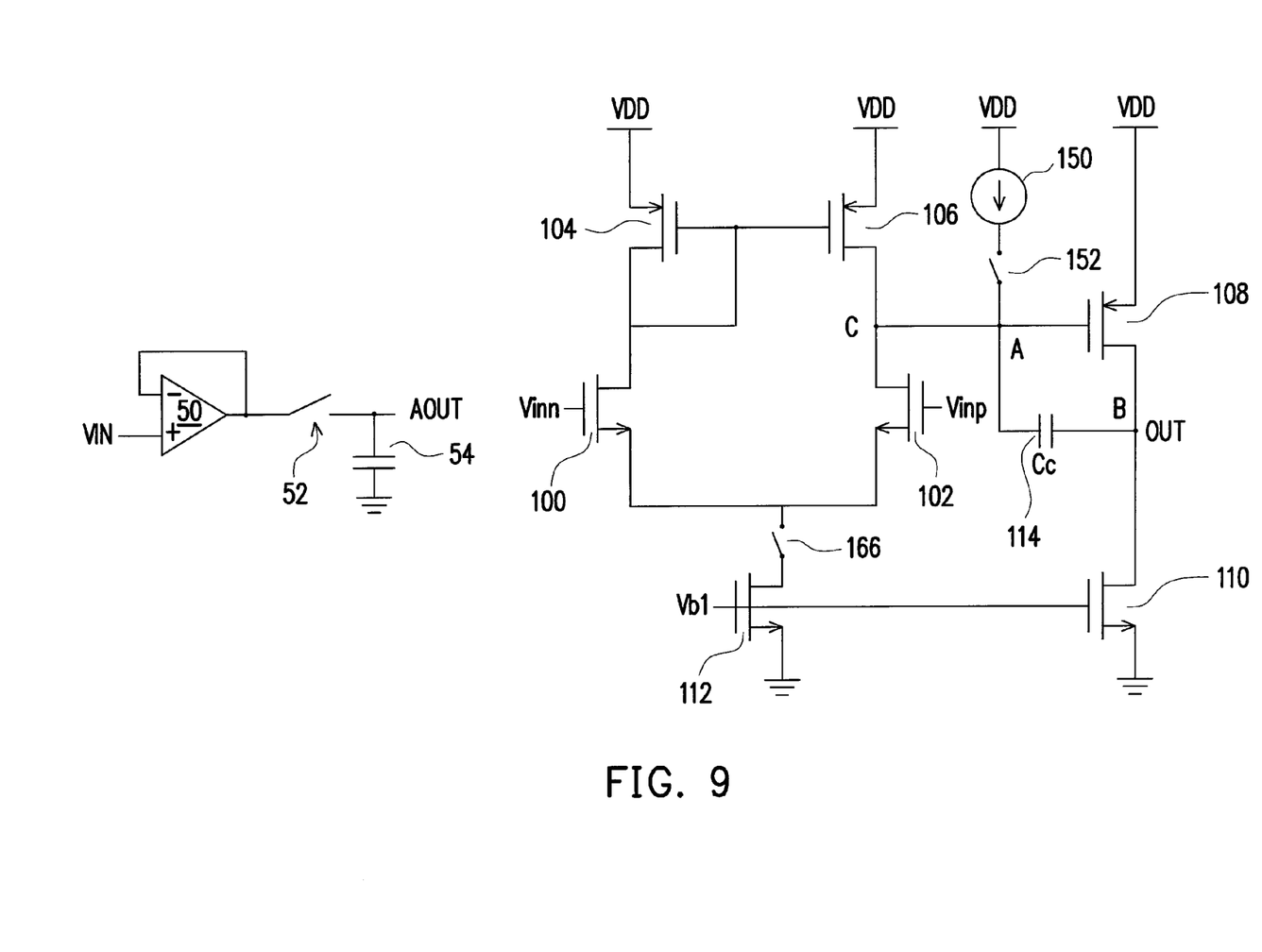

FIG. 9 is a diagram of an operational amplifier circuit according to an exemplary embodiment of the present invention. Referring to FIG. 9, compared to the structure illustrated in FIG. 5, the current source 150 in the present exemplary embodiment is still connected to the compensation capacitor 114 at the node A through the switch 152. However, the other switch 166 is not connected to the node C. Instead, the switch 166 is connected between the sources of the transistors 100 and 102 and the drain of the transistor 112.

The sources and drains of the transistors are exchangeable and are referred according to the actual circuit operation. Thus, the terms "source" and "drain" in the present disclosure are only used for the convenience of description.

When the switch 52 is turned off (i.e., the main circuit is not in the output state), the switch 166 is also turned off, and the switch 152 is turned on. Thus, when the main circuit is not in the output state, the current source 150 supplies a current to the compensation capacitor 114 to maintain a predetermined SR. Thereby, a large current generated at the charge/discharge instant is effectively eliminated and accordingly the problem of EMI is avoided.

When the switch 52 is turned on (i.e., the operational amplifier circuit is in a normal operation state), the switch 166 is turned on, and the switch 152 is turned off. Accordingly, the current source 150 and the compensation capacitor 114 are turned off, and the operational amplifier circuit returns to the normal operation state.

Figure 10:
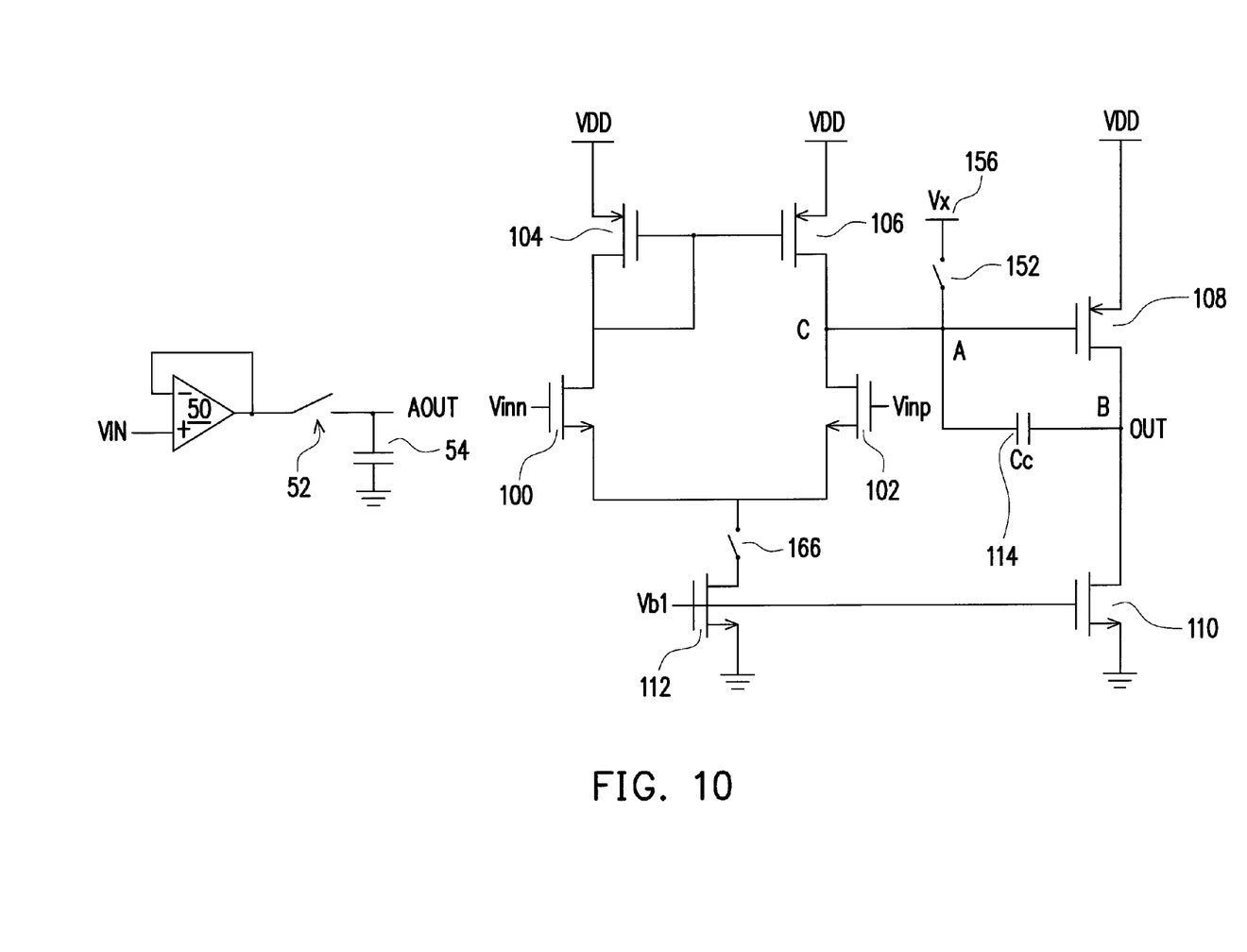

FIG. 10 is a diagram of an operational amplifier circuit according to an exemplary embodiment of the present invention. Referring to FIG. 10, the switch 152 and the switch 166 in the present exemplary embodiment are disposed in the same way as those illustrated in FIG. 9. However, in the present exemplary embodiment, a voltage source 156 is adopted as the power circuit for supplying a voltage Vx to the compensation capacitor 114. The value of the voltage Vx is determined according to the actual requirement. The voltage Vx needs not to be the system voltage VDD but can be any other voltage. The operations of the switch 152 and the switch 154 can be referred to descriptions related to FIG. 9.

The operational amplifier circuit can have different designs. In an exemplary embodiment of the present invention, the operational amplifier circuit is not limited to the circuit designs described above. The operational amplifier circuit may also have a symmetrical structure. To be specific, the operational amplifier circuit includes two main circuits, and the P-type transistors and the N-type transistors in the two symmetrically main circuits are exchangeable. A compensation capacitor is connected to the output terminal of each main circuit. Below, such a structure will be described with reference to a specific circuit.

Figure 11:
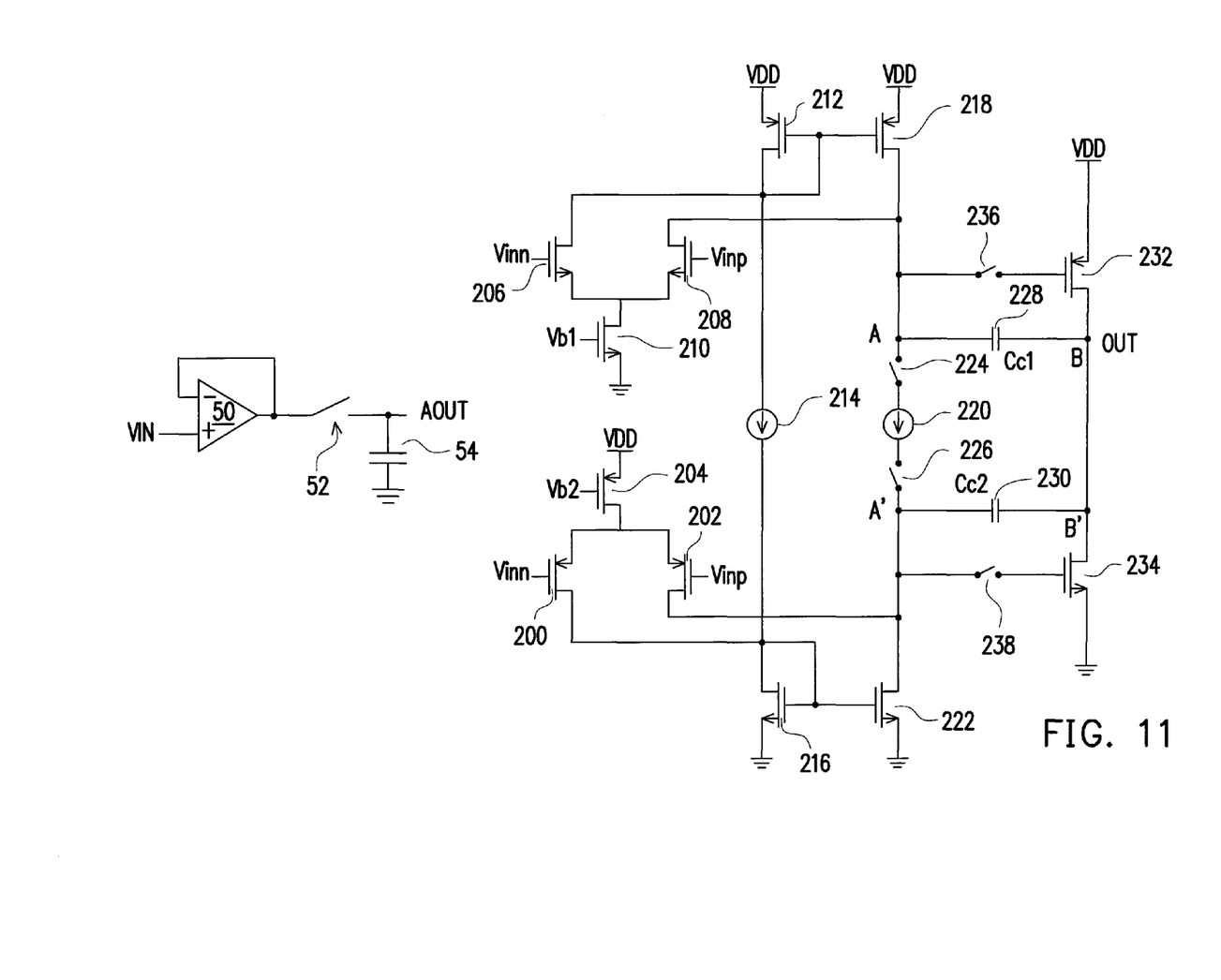

FIG. 11 is a diagram of an operational amplifier circuit according to an exemplary embodiment of the present invention. Referring to FIG. 11, the operational amplifier circuit 50 has a symmetrical structure. The voltage-to-current converting circuit is composed of two symmetrical pairs of transistors. The transistors 200 and 202 are P-type transistors and are connected to the power supply VDD through a P-type transistor 204. The gate of the transistor 204 is connected to a voltage Vb2. The other terminals of the transistors 200 and 202 are connected to the transistors 216 and 222 of the current operation circuit and then to the ground voltage. The gates of the transistors 200 and 202 are respectively a negative input terminal and a positive input terminal. The other pair of transistors 206 and 208 is N-type transistors. The sources of the transistors 206 and 208 are connected to the ground voltage through an N-type transistor 210. The gate of the transistor 204 is connected to a voltage Vb1. The sources of the transistors 206 and 208 are connected to the system voltage VDD through the transistors 212 and 218.

The current operation circuit 122 includes two current paths. One current path is composed of the transistor 212, the current source 214, and the transistor 216. The current source 214 is connected between the transistor 212 and the transistor 216. The other current path is composed of the transistor 218, the current source 220, and the transistor 222. The current source 220 is connected between the transistor 218 and the transistor 222.

The transistor 232 and the transistor 234 of the amplifying circuit 124 are a P-type transistor and an N-type transistor. The transistor 232 and the transistor 234 are connected at the output terminal OUT and an ends of the compensation capacitors 228 and 230 (i.e., the node B and the node B' are a common node). The other ends of the compensation capacitors 228 and 230 are respectively connected to the node A and the node A'. The capacitance of the compensation capacitor 228 is Cc1, and the capacitance of the compensation capacitor 230 is Cc2.

In the present exemplary embodiment, a temporary power circuit may also be formed by part of the operational amplifier circuit for supplying a current or a voltage to the compensation capacitor. The present exemplary embodiment is also described with reference to a structure having two symmetrical main circuits. However, the technique described in the present embodiment is also applicable to a structure having a single main circuit.

The structure in the present exemplary embodiment includes a plurality of switches 236, 238, 224, and 226. The switch 236 is connected between the gate of the transistor 232 and the node A. The switch 238 is connected between the gate of the transistor 234 and the node A'. The current source 220 is connected between the node A and the node A'.

When the switch 52 is turned off (i.e., the main circuit is not in the output state), the switches 236, 238, 224, and 226 are turned off. Accordingly, most part of the operational amplifier 50 is disconnected from the compensation capacitors 228 and 230, but the connections between the transistors 218 and 222 and the compensation capacitors 228 and 230 remain. When the main circuit is not in the output state, the system voltage VDD is supplied to the compensation capacitors 228 and 230 to maintain a predetermined SR. Thereby, a large current generated at the charge/discharge instant is effectively eliminated and accordingly the problem of EMI is avoided.

When the switch 52 is turned on (i.e., the operational amplifier circuit is in a normal operation state), the switches 236, 238, 224, and 226 are turned on. Accordingly, the current source 150 is disconnected from the compensation capacitor 114, and the operational amplifier circuit returns to the normal operation state.

Figure 12:
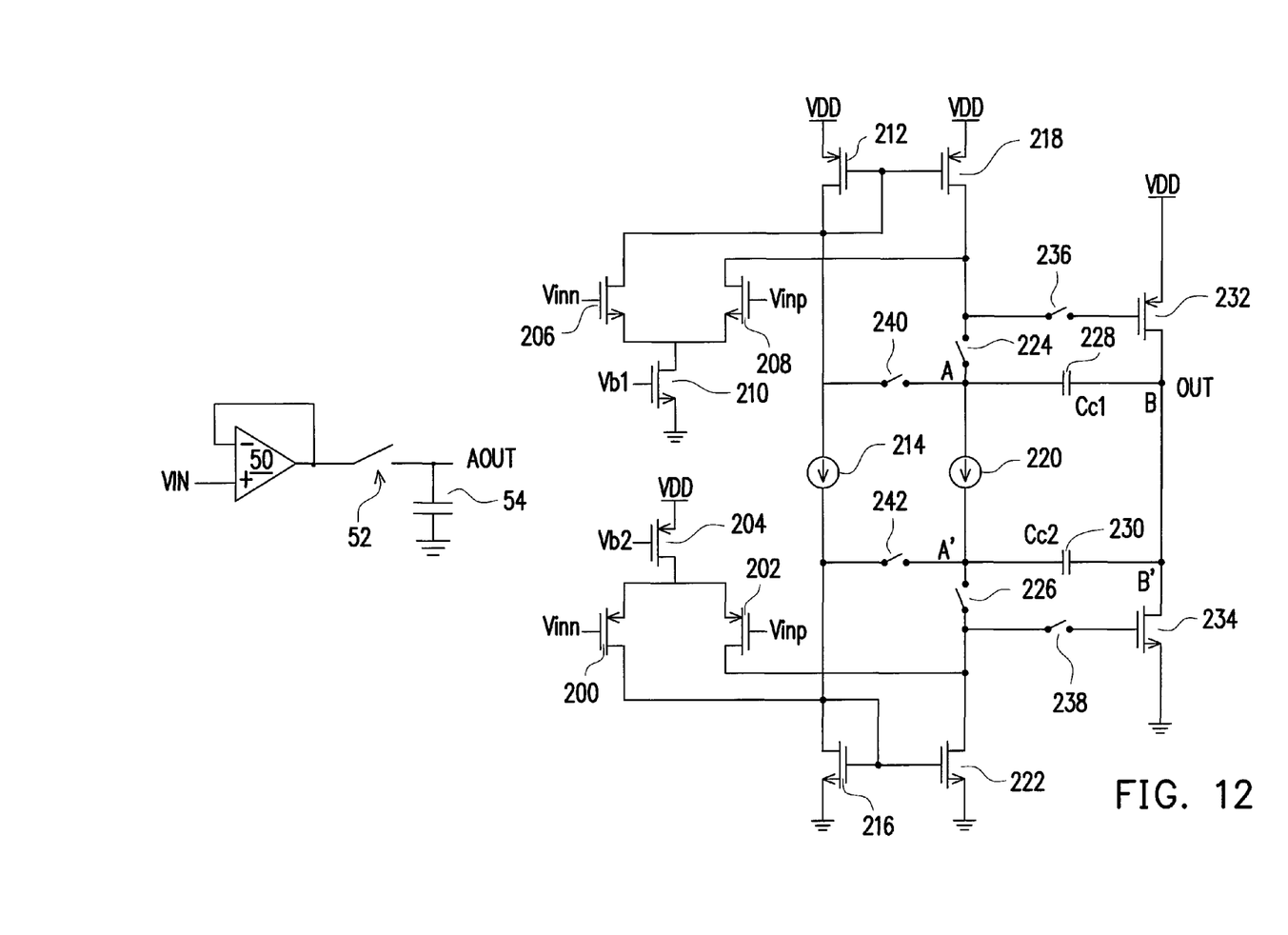

FIG. 12 is a diagram of an operational amplifier circuit according to an exemplary embodiment of the present invention. Referring to FIG. 12, based on the structure illustrated in FIG. 11, switches 240 and 242 are further disposed on the other current path. The switch 240 is connected between two terminals of the current source 214 and the current source 220. The switch 242 is connected between another two terminals of the current source 214 and the current source 220. The switch 224 is connected between the node A and the switch 236. The switch 226 is connected between the node A' and the switch 238. The current source 220 is between the node A and the node A'.

When the switch 52 is turned off (i.e., the main circuit is not in the output state), the switches 236, 238, 224, and 226 are turned off, and the switches 240 and 242 are turned on. The transistors 212 and 216 on the other current path of the operational amplifier 50 are connected to the compensation capacitors 228 and 230. The capacitance of the compensation capacitor 228 is Cc1, and the capacitance of the compensation capacitor 230 is Cc2. When the main circuit is not in the output state, the system voltage VDD is supplied to the compensation capacitors 228 and 230 to maintain a predetermined SR.

In an operational amplifier circuit having a compensation capacitor provided by an exemplary embodiment of the present invention, when the main circuit is not in an output state, a current or voltage is stilled supplied to the compensation capacitor regardless of the circuit structure of the operational amplifier circuit, so that a desired SR can be maintained and the problem of EMI can be resolved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An operational amplifier circuit, comprising:
a main circuit, having an output terminal;
a compensation capacitor, having a first end connected to an internal node of the main circuit, and a second end connected to the output terminal of the main circuit;
a power circuit, providing a current or a voltage as predetermined; and
a set of switches, connecting the power circuit to the compensation capacitor,
wherein when the main circuit is not in an output state, the set of switches is switched to allow the power circuit to provide the current or the voltage to the compensation capacitor, and the compensation capacitor is not sensing a voltage at the output terminal from the main circuit,
wherein when the main circuit is in the output state, the set of switches is switched to disconnect the power circuit from the compensation capacitor and allow the main circuit to return to an output circuit state and operate normally.

2. The operational amplifier circuit according to claim 1, wherein the set of switches comprises a first switch and a second switch,
wherein the power circuit is connected to the first end of the compensation capacitor through the first switch, and the second switch is connected between the first end of the compensation capacitor and the internal node of the main circuit,
wherein when the main circuit is not in the output state, the first switch is turned on, and the second switch is turned off, and when the main circuit is in the output state, the first switch is turned off, and the second switch is turned on.

3. The operational amplifier circuit according to claim 2, wherein the power circuit is a current source.

4. The operational amplifier circuit according to claim 2, wherein the power circuit is a voltage source.

5. The operational amplifier circuit according to claim 1, wherein the power circuit comprises a first power supply and a second power supply, the set of switches comprises a first switch, a second switch, a third switch, and a fourth switch, a first terminal of the first power supply is connected to a first voltage, a first terminal of the second power supply is connected to a second voltage, and the first voltage is higher than the second voltage,
wherein a second terminal of the first power supply is connected to the first end of the compensation capacitor through the first switch, and the second switch is connected between the first end of the compensation capacitor and the internal node of the main circuit,
wherein a second terminal of the second power supply is connected to the second end of the compensation capacitor through the third switch, and the fourth switch is connected between the second end of the compensation capacitor and the output terminal of the main circuit,
wherein when the main circuit is not in the output state, the first switch and the third switch are turned on, and the second switch and the fourth switch are turned off, and when the main circuit is in the output state, the first switch and the third switch are turned off, and the second switch and the fourth switch are turned on.

6. The operational amplifier circuit according to claim 5, wherein the first power supply and the second power supply are current sources.

7. The operational amplifier circuit according to claim 5, wherein the first power supply and the second power supply are voltage sources.

8. The operational amplifier circuit according to claim 1, wherein the set of switches comprises a first switch and a second switch,
wherein the power circuit is connected to the first end of the compensation capacitor through the first switch, the second switch is disposed on an internal path of the main circuit, and when the second switch is turned off, the main circuit does not provide the current or the voltage to the compensation capacitor,
wherein when the main circuit is not in the output state, the first switch is turned on, and the second switch is turned off, and when the main circuit is in the output state, the first switch is turned off, and the second switch is turned on.

9. The operational amplifier circuit according to claim 8, wherein the power circuit is a current source.

10. The operational amplifier circuit according to claim 8, wherein the power circuit is a voltage source.

11. An operational amplifier circuit, comprising:
a main circuit, having an output terminal;
a compensation capacitor, having a first end connected to an internal node of the main circuit, and a second end connected to the output terminal of the main circuit; and
a set of switches, disposed on a connection path between the main circuit and the compensation capacitor,
wherein when the main circuit is not in an output state, the set of switches is switched to allow a part of the main circuit to form a power circuit and provide a current or a voltage to the compensation capacitor, and the compensation capacitor is not sensing a voltage at the output terminal from the main circuit,
wherein when the main circuit is in the output state, the set of switches is switched to allow the main circuit to return to an output circuit state and operate normally.

12. The operational amplifier circuit according to claim 11, wherein the set of switches comprises a first switch and a second switch,
wherein a first terminal of the first switch is connected to the first end of the compensation capacitor, a second terminal of the first switch is connected to a gate of a transistor in an amplifying circuit of the main circuit, and a drain of the transistor is the output terminal,
wherein the second switch is connected between the first end of the compensation capacitor and a first current source of a current operation circuit of the main circuit,
wherein when the main circuit is not in the output state, the first switch and the second switch are turned off, and the part of the main circuit still connected to the compensation capacitor forms the power circuit,
wherein when the main circuit is in the output state, the first switch and the second switch are turned on, so that the main circuit returns to the output circuit state and operates normally.

13. The operational amplifier circuit according to claim 12, wherein the set of switches comprises a third switch, the current operation circuit further comprises a second current source, and the third switch is connected between the first current source and the second current source,
wherein when the first switch is turned on, the third switch is turned off, and when the first switch is turned off, the third switch is turned on.

14. The operational amplifier circuit according to claim 11, wherein the main circuit comprises a first main circuit and a second main circuit having symmetrically connection structures, the first main circuit comprises a plurality of transistors, the second main circuit comprises a plurality of transistor, and types of the transistors in the second main circuit are opposite to types of the transistors in the first main circuit,
wherein a current operation circuit of the main circuit has a first current path and a second current path, the first current path has a first current source connected between the first main circuit and the second main circuit, and the second current path has a second current source connected between the first main circuit and the second main circuit,
wherein the compensation capacitor comprises a first compensation capacitor and a second compensation capacitor, the first compensation capacitor and the second compensation capacitor are disposed respectively corresponding to the first main circuit and the second main circuit, and the first compensation capacitor and the second compensation capacitor respectively have the first end and the second end.

15. The operational amplifier circuit according to claim 14, wherein the set of switches comprises a first switch and a second switch disposed in the first main circuit and a third switch and a fourth switch disposed in the second main circuit,
wherein a first terminal of the first switch is connected to the first end of the first compensation capacitor, a second terminal of the first switch is connected to a gate of a transistor in an amplifying circuit of the first main circuit, and a drain of the transistor is the output terminal,
wherein the second switch is connected between the first end of the first compensation capacitor and the first current source,
wherein a first terminal of the third switch is connected to the first end of the second compensation capacitor, a second terminal of the third switch is connected to a gate of a transistor in an amplifying circuit of the second main circuit, and a drain of the transistor is the output terminal,
wherein the fourth switch is connected between the first end of the second compensation capacitor and the first current source,
wherein when the main circuit is not in the output state, the first switch, the second switch, the third switch, and the fourth switch are turned off, and the part of the main circuit still connected to the compensation capacitor forms the power circuit,
wherein when the main circuit is in the output state, the first switch, the second switch, the third switch, and the fourth switch are turned on, so that the main circuit returns to the output circuit state and operates normally.

16. The operational amplifier circuit according to claim 15, wherein the set of switches comprises a first switch, a second switch, and a third switch disposed in the first main circuit and a fourth switch, a fifth switch, and a sixth switch disposed in the second main circuit,
wherein a first terminal of the first switch is connected to the first end of the first compensation capacitor through the second switch, a second terminal of the first switch is connected to a gate of a transistor in an amplifying circuit of the first main circuit, and a drain of the transistor is the output terminal,
wherein the second switch is connected between the first end of the first compensation capacitor and the first terminal of the first switch, wherein a first terminal of the third switch is connected to the first end of the first compensation capacitor, a second terminal of the third switch is connected to a first terminal of the second current source of the second current path, wherein a first terminal of the fourth switch is connected to the first end of the second compensation capacitor through the fifth switch, a second terminal of the fourth switch is connected to a gate of a transistor in an amplifying circuit of the second main circuit, and a drain of the transistor is the output terminal, wherein the fifth switch is connected between the first end of the first compensation capacitor and the first terminal of the fourth switch, wherein a first terminal of the sixth switch is connected to the first end of the second compensation capacitor, a second terminal of the sixth switch is connected to a second terminal of the second current source of the second current path, wherein when the main circuit is not in the output state, the first switch, the second switch, the fourth switch, and the fifth switch are turned off, the third switch and the sixth switch are turned on, and a power supply of the second current path charges the first compensation capacitor and the second compensation capacitor, wherein when the main circuit is in the output state, the first switch, the second switch, the fourth switch, and the fifth switch are turned on, and the third switch and the sixth switch are turned off, and the main circuit returns to the output circuit state and operates normally.

* * * * *